United States Patent [19]

Biran

[11] 4,278,707

[45] Jul. 14, 1981

[54] METHOD FOR COATING THE EDGE OF A PRINTED CIRCUIT BOARD TO IMPROVE ITS MOISTURE RESISTANCE

[75] Inventor: Joseph Biran, Sunnyvale, Calif.

[73] Assignee: Hewlett-Packard Company, Palo Alto, Calif.

[21] Appl. No.: 151,010

[22] Filed: May 19, 1980

[51] Int. Cl.³ .............................................. H05K 3/28
[52] U.S. Cl. ....................................... 427/96; 427/98; 427/123; 427/284; 427/290; 29/846
[58] Field of Search ................... 427/97, 98, 284, 123, 427/96, 290, 292; 204/31; 29/430, 846–849, 852; 428/901

[56] References Cited

U.S. PATENT DOCUMENTS 4,012,307 3/1977 Phillips ............................. 29/852 x

FOREIGN PATENT DOCUMENTS 664915 6/1963 Canada ..................................... 29/846

OTHER PUBLICATIONS

Thams, Abstract of Belgium Patent 880447, 4-1-80, Dorwent Publications LTD. Abstract #27307.

Primary Examiner—John D. Smith
Assistant Examiner—Bernard F. Plantz
Attorney, Agent, or Firm—Edward Y. Wong

[57] ABSTRACT

By sealing the periphery of a printed circuit board, the previously exposed edges of the board are substantially prevented from moisture wicking. This sealing of the periphery can be made concurrently with the plating of through-holes on the board. With this process, current leakage paths due to board moisture wicking within the board is significantly reduced.

2 Claims, 2 Drawing Figures

METHOD FOR COATING THE EDGE OF A PRINTED CIRCUIT BOARD TO IMPROVE ITS MOISTURE RESISTANCE

BACKGROUND OF THE INVENTION

This invention relates to a new manufacturing method of printed circuit boards (PCB's) in general and of PCB's with plated-through holes in particular. It results in improved moisture resistance of PCB's.

In circuit boards where high accuracies and high impedances are required, for example, impedances greater than one (1) megohms as in digital multimeter PCB's, special precautions have to be taken to minimize current leakage paths in the PCB's by maintaining high impedances of the board. Typical special precautions taken are conformal coating, that is coating all components on the board with some insulating compound, and elevating from the board all the critical points in the circuit by means of insulator stand-offs.

In PCB's made of glass-epoxy phenolic or paper laminate, for instance, a major source of current leakage paths is moisture wicking in through the periphery of the board where capillary action through the exposed PCB edge causes the moisture wicking. This moisture wicking, in turn, causes current leakage paths within the PCB.

In the typical process of sizing the board, for example, the routing operation exposes raw fibers at the edges of a glass-epoxy board to the ambient environment. Thus, in a high moisture environment, the moisture wicking problem earlier described is especially severe, and the problem of current leakage is especially pronounced. To compound the problem, the usual special precautions of conformal coating and insulator stand-offs do not effectively address this problem of leakage paths caused by moisture wicking of the PCB.

SUMMARY OF THE INVENTION

The method in accordance with the invention is to apply a metal plating around the edges of the PCB during its manufacture. In this way, the edges of the PCB is effectively sealed so that moisture cannot penetrate into the board material. This added step in the typical manufacturing process of PCB's tends to significantly reduce current leakages due to moisture wicking.

DETAILED DESCRIPTION OF THE PREFERRED EMBODIMENT

Figure 1:
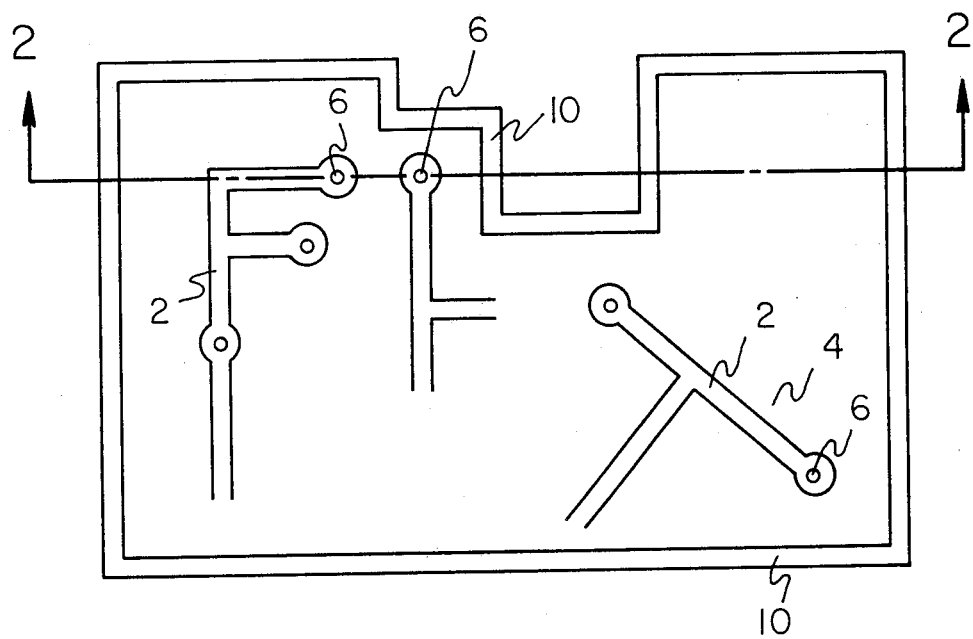
FIG. 1 illustrates a typical printed circuit board.
Figure 2:
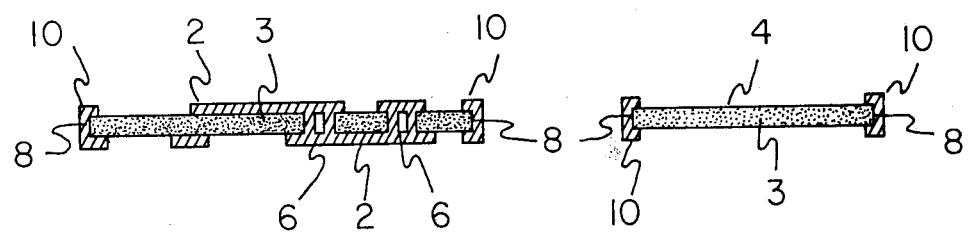
FIG. 2 shows a cross-section of the printed circuit board of FIG. 1.

In manufacturing a PCB in accordance with the invention as representative in FIGS. 1 and 2, traces 2 of conductive material is defined on the surface of a nonconducting board 4. If the circuit to the PCB is complicated, both sides of the board can contain conductive traces. In the latter case, there would be plated throughholes 6 on the board to form electrical interconnections between traces on the two sides of the board. The PCB, if it has not been previously sized, is then sized, typically by routing. This step leaves the edge 8 of the board exposed. The method in accordance to the invention deposits a sealant 10 on the periphery of the board, thereby effectively sealing the previously exposed edges. The sealant is in the form of a plating of metal. In the case of two-sided boards, this sealing step can occur concurrently with the step of plating the through-holes. This final step of sealing the periphery of the board effectively reduces moisture in the board by moisture wicking through exposed edges.

I claim:

1. A method for manufacturing printed circuit boards having fibers therein comprising the steps of:
   defining conductive traces on a non-conductive board;
   sizing the non-conductive board to expose raw fibers at the periphery of the board; and then
   coating the periphery of the board to seal the periphery and to prevent moisture penetration into the board.

2. The method as in claim 1 wherein the step of coating the periphery of the board comprises the step of plating the periphery of the board with a metal coating.

* * * * *